United States Patent
Kishimoto et al.

(10) Patent No.: US 11,441,054 B2
(45) Date of Patent: Sep. 13, 2022

(54) MANUFACTURING METHOD OF ADHESIVE LAYER AND DISPLAY DEVICE COMPRISING THE ADHESIVE LAYER MANUFACTURED THEREBY

(71) Applicant: Samsung Display Co., LTD., Yongin-si (KR)

(72) Inventors: Hirotsugu Kishimoto, Hwaseong-si (KR); Cheol ho Choi, Asan-si (KR); Hyun-Been Hwang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 16 days.

(21) Appl. No.: 17/001,936

(22) Filed: Aug. 25, 2020

(65) Prior Publication Data

US 2021/0269680 A1    Sep. 2, 2021

(30) Foreign Application Priority Data

Feb. 17, 2020    (KR) .................. 10-2020-0018820

(51) Int. Cl.
*C09J 7/38*        (2018.01)
*C09J 11/08*       (2006.01)
(Continued)

(52) U.S. Cl.
CPC ............... *C09J 7/381* (2018.01); *C09J 11/08* (2013.01); *G02B 5/3033* (2013.01); *G02F 1/1335* (2013.01); *B32B 37/12* (2013.01); *B32B 38/10* (2013.01); *C09J 5/02* (2013.01); *C09J 2203/318* (2013.01); *G02F 2202/28* (2013.01); *Y10T 156/1111* (2015.01)

(58) Field of Classification Search
CPC ............ B29C 71/0009; B29C 71/0018; B29C 71/0027; B29C 71/0036; B29C 71/0045; B29C 71/0054; B29C 71/009
See application file for complete search history.

(56) References Cited

U.S. PATENT DOCUMENTS 9,661,114 B2 *    5/2017    Jeong .................. G06F 3/044
9,926,470 B2 *    3/2018    Carty .................. C09J 7/38
(Continued)

FOREIGN PATENT DOCUMENTS

KR    1020150088101 A    7/2015
KR    1020180133287 A    12/2018

OTHER PUBLICATIONS

Cheung et al, Silicone additives increase solids and lower VOCs in solventborne systems, Sep. 4, 2012 (Year: 2012).*

*Primary Examiner* — Francisco W Tschen
*Assistant Examiner* — Abhishek A Patwardhan
(74) *Attorney, Agent, or Firm* — Cantor Colburn LLP

(57) ABSTRACT

A manufacturing method of an adhesive layer includes: providing a preliminary adhesive layer, attaching a mask to a first area portion of the preliminary adhesive layer, and thereby, provide a second area portion of the preliminary adhesive layer that is adjacent to the first area portion and to which the mask is not attached, to provide an adhesive layer that exhibits good folding reliability. In addition, a display device may exhibit good folding reliability characteristics by including the adhesive layer from which an adhesion force of a folding area is reduced between a supporting member and a display panel of the display device.

10 Claims, 11 Drawing Sheets

(51) Int. Cl.
*G02F 1/1335* (2006.01)
*G02B 5/30* (2006.01)
*B32B 38/10* (2006.01)
*B32B 37/12* (2006.01)
*C09J 5/02* (2006.01)

(56) References Cited

U.S. PATENT DOCUMENTS

| | | | |
|---|---|---|---|
| 10,074,701 B2 | 11/2018 | Jeong et al. | |
| 10,522,599 B2 | 12/2019 | Jeong et al. | |
| 2006/0292323 A1* | 12/2006 | Hutchinson | C08J 7/046 |
| | | | 428/36.91 |
| 2015/0184033 A1* | 7/2015 | Iwai | H01L 21/30625 |
| | | | 438/692 |
| 2017/0243523 A1* | 8/2017 | Potter | B31D 1/021 |
| 2018/0352664 A1 | 12/2018 | Park et al. | |
| 2019/0232526 A1* | 8/2019 | Oribe | C04B 35/486 |
| 2019/0352790 A1* | 11/2019 | Deodhar | C25D 11/08 |

\* cited by examiner

FIG. 4
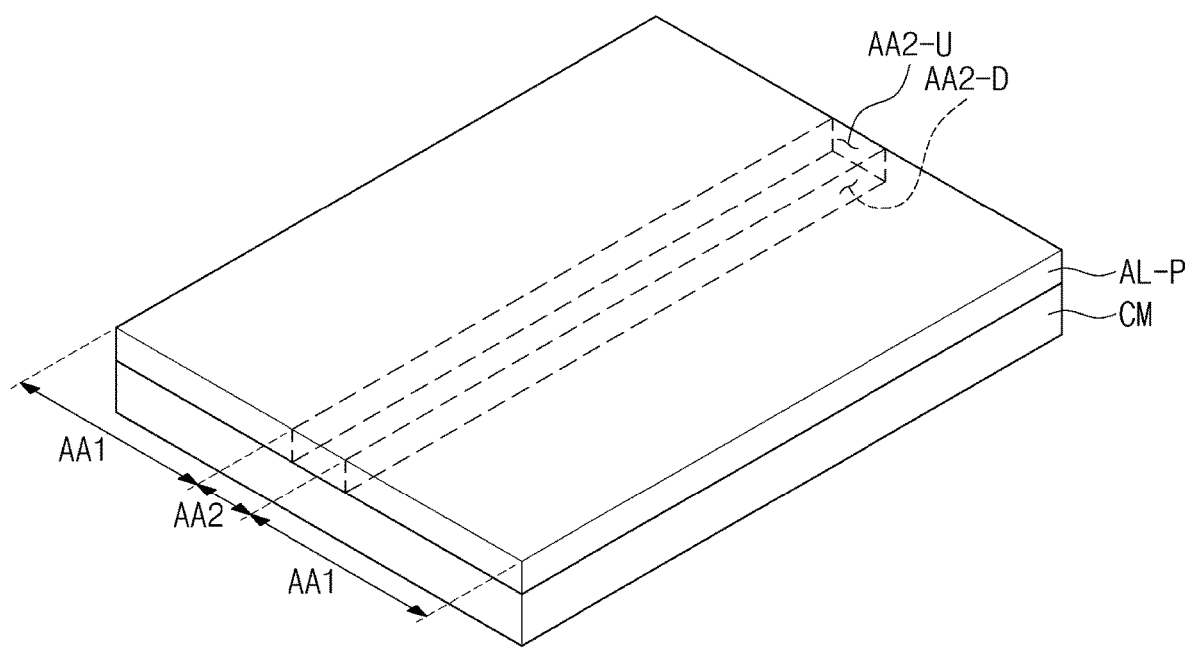
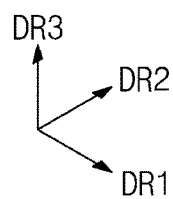

MANUFACTURING METHOD OF ADHESIVE LAYER AND DISPLAY DEVICE COMPRISING THE ADHESIVE LAYER MANUFACTURED THEREBY

CROSS-REFERENCE TO RELATED APPLICATION

This U.S. non-provisional patent application claims priority under 35 U.S.C. § 119 of Korean Patent Application No. 10-2020-0018820, filed on Feb. 17, 2020, the content of which is incorporated herein by reference in its entirety.

BACKGROUND

The present disclosure herein relates to a manufacturing method of an adhesive layer, and a display device including the adhesive layer, and more particularly, to a manufacturing method of an adhesive layer for use in a foldable display device, and a foldable display device including the adhesive layer.

A display device provides information for a user by displaying various images on a display screen. In general, the display device displays information in an allocated screen. Recently, flexible display devices including flexible display panels capable of folding or bending are of great interest and are being developed. The flexible display devices may be folded, rolled, or bent, unlike that of rigid display devices. The flexible display devices in its various forms allows for greater portability regardless of the screen size, while improving a user's readability of the information presented on a larger screen.

However, the technical development of a foldable or flexible device is not without difficulty, and what one may find is that the repeated deformation of the display screens in the area of folding (unfolding) or bending (straightening) of these display devices can lead to unsatisfactory performance of the display device over time.

SUMMARY

The present disclosure provides a manufacturing method of an adhesive layer which exhibits good folding reliability with repeated folding and unfolding over time.

The present disclosure also provides a display device having less deformation of a display surface following the repeated folding and unfolding of the display device.

An embodiment of the inventive concept provides a manufacturing method of an adhesive layer, the method including: providing a preliminary adhesive layer; attaching a mask to a first area portion of the preliminary adhesive layer, providing a removal solution containing an additive and a solvent for a second area portion of the preliminary adhesive layer that is adjacent to the first area portion and to which the mask is not attached.

In an embodiment, the preliminary adhesive layer may include a silicone-containing resin.

In an embodiment, the additive may include a silicon-containing compound.

In an embodiment, the silicon-containing compound may include a compound represented by Formula 1 below:

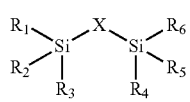

Formula 1

In Formula 1 above, X may be NH or O, and $R_1$ to $R_6$ may be each independently a hydrogen atom, a halogen atom, a substituted or unsubstituted alkyl group having 1 to 10 carbon atoms, or a substituted or unsubstituted aryl group having 6 to 10 carbon atoms.

In one embodiment, $R_1$ to $R_6$ may be each independently an unsubstituted alkyl group having 1 to 5 carbon atoms.

In an embodiment, the silicon-containing compound may include a compound represented by Formula 2 below:

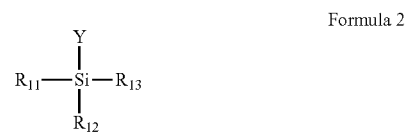

Formula 2

In Formula 2 above, Y may be Cl, Br, I, or $OR_{14}$, and $R_{11}$ to $R_{14}$ may be each independently a hydrogen atom, a halogen atom, a substituted or unsubstituted alkyl group having 1 to 10 carbon atoms, or a substituted or unsubstituted aryl group having 6 to 10 carbon atoms.

In an embodiment, $R_{11}$ to $R_{14}$ above may be each independently an unsubstituted alkyl group having 1 to 5 carbon atoms.

In an embodiment, the providing of the removal solution may include immersing the masked preliminary adhesive layer into the removal solution.

In an embodiment, the providing of the removal solution may include spraying the removal solution on a surface of the second area portion of the adhesive layer.

In an embodiment, the solvent may include at least one of alcohol, xylene, toluene, benzene, or formamide.

In an embodiment, the attaching of the mask provides an initial adhesion force of the first area portion of the preliminary adhesive layer, and an initial adhesion force of the second area portion of the preliminary adhesive layer, are the same.

In an embodiment, after the providing of the removal solution containing the additive and the solvent for the second area of the preliminary adhesive layer, the initial adhesion force of the first area portion may be maintained, and a contacted adhesion force of the second area portion may be reduced, i.e., less than the initial adhesion force of the second area portion.

In an embodiment of the inventive concept, a display device including: a supporting member including a first supporting part and a second supporting part which are spaced apart from each other; a display panel spaced apart from each other and disposed on the first and the second supporting members, and a folding area disposed between the non-folding areas; and an adhesive layer including a first area portion corresponding to the non-folding areas and a second area portion corresponding to the folding area portion, which are disposed between the supporting member and the display panel, wherein the space between the first supporting part and the second supporting part overlaps the second area.

In an embodiment, an adhesion force of a first surface of the second area portion adjacent to the first and the second supporting members may be less than that of a second surface of the second area portion adjacent to the display panel.

In an embodiment, an adhesion force of a first surface of the second area portion adjacent to the first and the second supporting members may be less than that of the first area portion corresponding to the non-folding areas.

In an embodiment, an adhesion force of a second surface of the second area portion may be the same as that of the first area portion.

In an embodiment, the display panel may be unfolded such that the non-folding areas are disposed in a parallel manner in a first mode, and may be folded such that the non-folding areas are laid over each other in a second mode.

In an embodiment, one edge of the first supporting part and one edge of the second supporting part, which are adjacent to each other in the first mode, may overlap the folding area and the second area, and one edge of the first supporting part and one edge of the second supporting part in the second mode may be spaced apart from the second area.

In an embodiment, the adhesive layer may include a silicone-containing resin.

In an embodiment, the adhesive layer may be formed from the preliminary adhesive layer, and an initial adhesion force of the first area portion of the preliminary adhesive layer, and an initial adhesion force of the second area portion of the preliminary adhesive layer, are the same.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 4 is a perspective view illustrating a portion of a manufacturing method of an adhesive layer according to an embodiment of the inventive concept;

DETAILED DESCRIPTION

Figure 1:
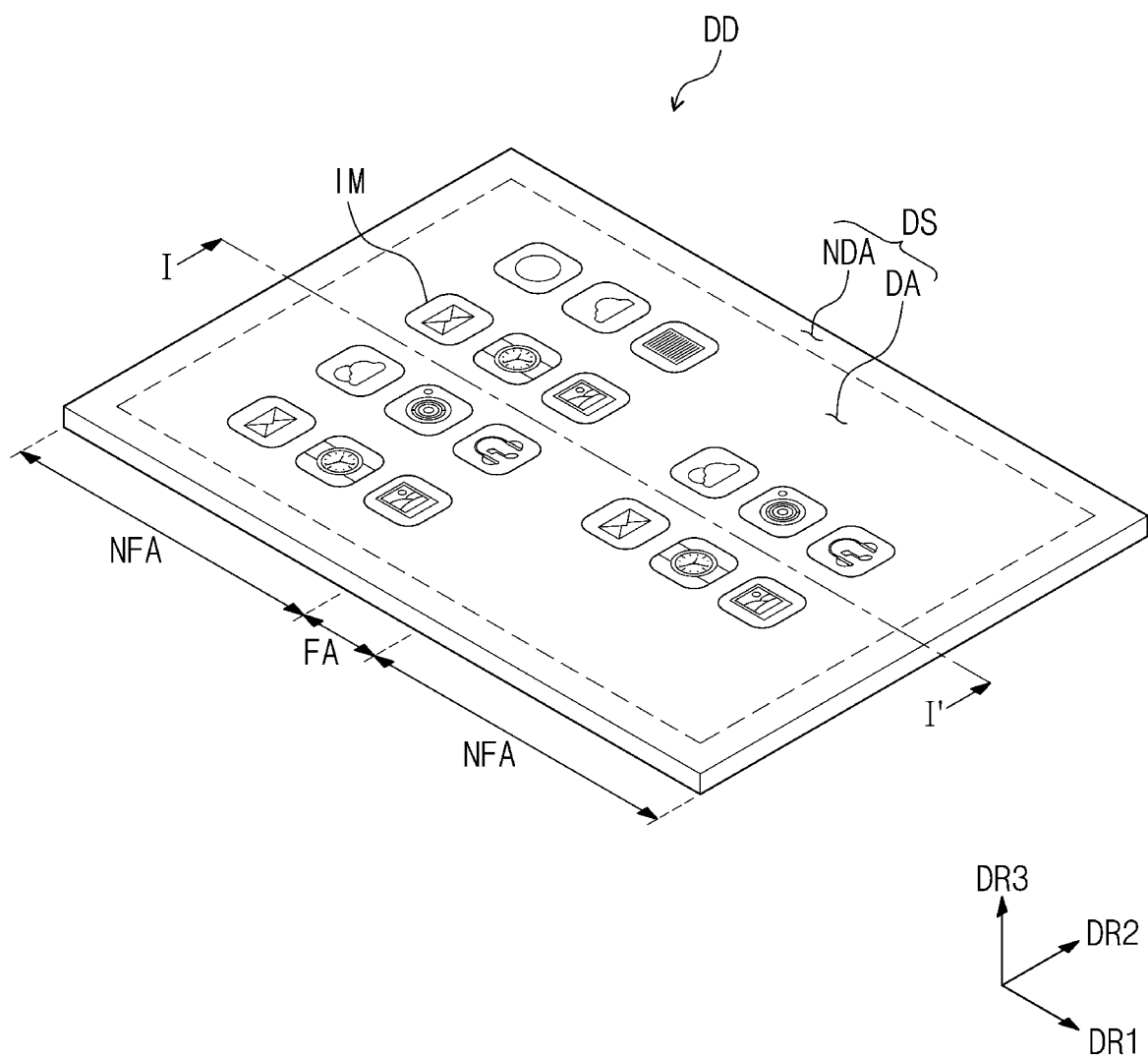
FIG. 1 is a perspective view illustrating a display device according to an embodiment of the inventive concept.

The inventive concept may have various modifications and may be embodied in different forms, and example embodiments will be explained in detail with reference to the accompanying drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

In the description, it will be understood that when an element (an area, a layer, a section, or the like) is referred to as being "on", "connected to" or "coupled to" another element, it may be directly disposed on, connected or coupled to the other element, or an intervening third element may be disposed therebetween. Meanwhile, being "directly disposed on" herein means that there are no intervening layers, films, areas, plates, or the like between a part such as a layer, a film, an area, and a plate and another part. For example, being "directly disposed on" may mean being disposed between two layers or two members without using an additional member, such as an adhesive member.

Like numbers refer to like elements throughout. Also, in the drawings, the thickness, the ratio, and the dimensions of elements are exaggerated for an effective description of technical contents. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are interpreted as being expressly defined herein unless they are interpreted in an ideal or overly formal sense.

The term "maintains" or "maintained" as used herein refers to a relatively small difference, which would include no measurable difference, in a measured value of an adhesive force between two surfaces as provided by an adhesive layer described herein. Accordingly, the term "maintain" or "maintained" can refer to a difference in a measured value of an adhesive force of less than 10%, 5%, or 2%. Of particular interest is a measured difference in a measured value of an adhesive force between two surfaces as provided by an adhesive layer following the contact of portions of masked and unmasked portions of an adhesive layer with a removal solution.

Hereinafter, a manufacturing method of an adhesive layer and a display device according to an embodiment of the inventive concept will be described with reference to the drawings.

Figure 2:
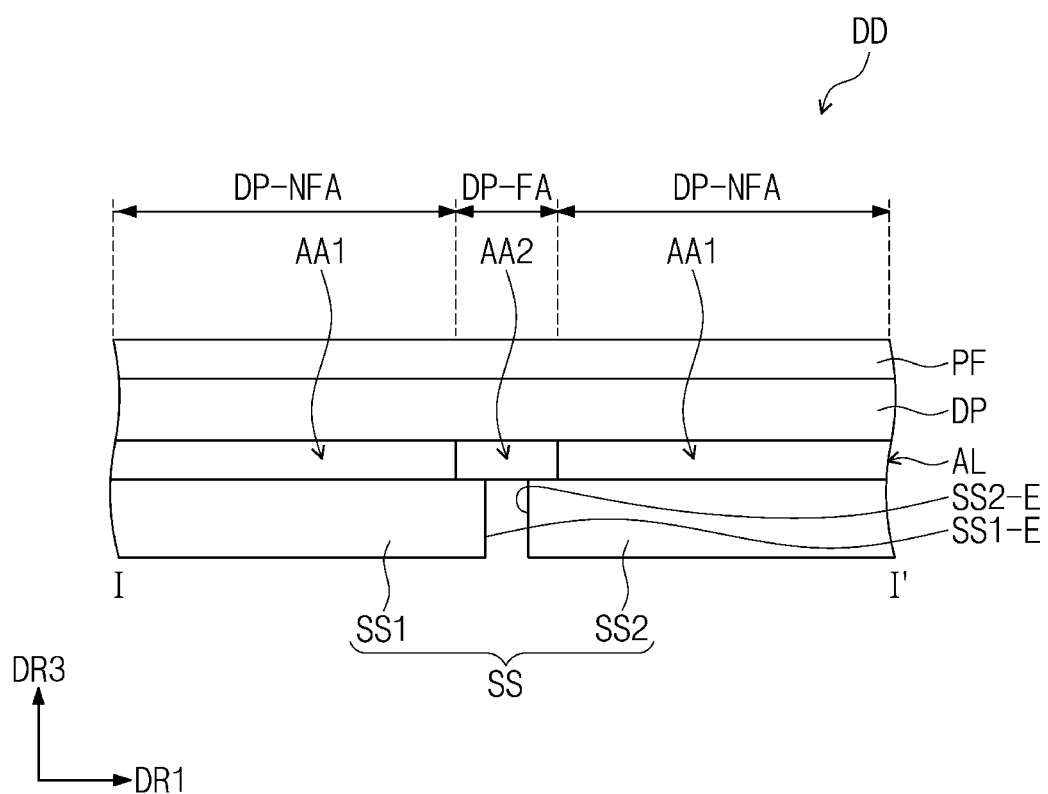
FIG. 2 is a cross-sectional view illustrating a part taken along line I-I' of FIG. 1.

FIG. 1 illustrates a display device DD according to an embodiment of the inventive concept. FIG. 2 is a cross-sectional view illustrating a part taken along line I-I' of FIG. 1.

In FIG. 1, a mobile electronic device is illustrated as an example of the display device DD. However, the display device DD may be used in large scale electronic devices such as a television, a monitor, or an outdoor advertising board, as well as, in small-to-medium scale electronic devices such as a personal computer, a laptop computer, a personal digital terminal, a vehicle navigation unit, a game console, a smart phone, a tablet, and a camera. These are merely provided as embodiments, and thus other electronic devices may be adopted as long as not departing from the inventive concept.

Referring to FIG. 1, a display device DD may display an image IM through a display surface DS. The display surface DS includes a display area DA on which the image IM is displayed and a non-display area NDA adjacent to the display area DA. In the non-display area NDA, an image is not displayed.

The display area DA may have a tetragonal shape. The non-display area NDA may surround the display area DA. However, the embodiment of the inventive concept is not limited thereto, and the shapes of the display area DA and the non-display area NDA may be relatively designed. Also, the non-display area NDA may not be present on a front surface of the display device DD.

The display device DD according to an embodiment may be a flexible display device which may be folded or bent or may be maintained in a folded state or a bended state. In the description, the term "flexible" means bendable characteristics, and is not limited to a structure in which the device is bent and completely folded, but may include a bent structure having a gap with several nanometers.

Referring to FIG. 1, the display device DD may include a folding area FA and non-folding areas NFA adjacent to the folding area FA. FIG. 1 illustrates that the two non-folding areas NFA are disposed to either side of the folding area FA, and the folding area FA and the non-folding areas NFA are arranged along an extending direction of the first directional axis DR1. Of course, it is well understood that a display device may have more than one folding area and more than two non-folding areas. For example, a rollable device may have any number or a plurality of folding areas that separate any number of or a plurality of adjacent pair of non-folding areas.

FIG. 1 illustrates one folding area FA and two non-folding areas NFA, but this is illustrated as an example, and the number of folding areas and non-folding areas is not limited. For example, two folding areas and three non-folding areas which are disposed adjacent to the both sides of folding areas may be included.

Referring to FIG. 2, the display device DD according to an embodiment may include a supporting member SS, an adhesive layer AL disposed on the supporting member SS, a display panel DP disposed on the adhesive layer AL, and a protective film PF disposed on the display panel DP.

The supporting member SS may include a first supporting member SS1 and a second supporting member SS2 which are spaced apart from each other. The first supporting member SS1 and the second supporting member SS2 may be spaced apart from each other in an extending direction of the first directional axis DR1. The first supporting member SS1 and the second supporting member SS2 may be spaced apart corresponding to the folding area DP-FA of the display panel DP. A portion of the first supporting member SS1 may overlap the folding area DP-FA, and a portion of the second supporting member SS2 may overlap the folding area DP-FA. That is, in the extending direction of the directional axis DR1, the spaced distance between the first supporting member SS1 and the second supporting member SS2 may be shorter than a width of the folding area DP-FA in the DR1 direction. Meanwhile, FIG. 2 illustrates a supporting member SS that includes supporting member SS1 and SS2, but as noted above, any number of pairs of the supporting members SS is possible including three or more according to the number of the folding area DP-FA and the non-folding area DP-NFA.

The display panel DP may include the folding area DP-FA and the non-folding areas DP-NFA. The folding area DP-FA of the display panel DP corresponds to a folding area FA of the display device DD, and the non-folding areas DP-NFA of the display panel DP corresponds to the non-folding areas NFA of the display device DD.

The protective film PF may be disposed on the display panel DP. The protective film PF may have high transparency in the visible region, and thereby, allow an image provided from the display panel DP to be visible. The PF may also function to protect the display panel DP against an external impact. However, the embodiments are not limited thereto, and the protective film PF may be omitted.

The adhesive layer AL may be disposed between the supporting member SS and the display panel DP, and the adhesive layer AL may include a first area portion AA1 and a second area portion AA2. FIG. 2 illustrates that the adhesive layer AL includes two first areas AA1 and a second area AA2 disposed between the first areas AA1. The first areas AA1 may be disposed adjacent to each side of the second area AA2. The second area portion AA2 may correspond to the folding area DP-FA, and the first area portions AA1 may correspond to the non-folding areas DP-NFA. An adhesion force of the first area portion AA1 may be different from that of the second area portion AA2.

An adhesion force of a first surface AA2-D of the second area portion AA2 may be different from that of a second surface AA2-U of the second area portion AA2, see FIG. 4. The first surface AA2-D of the second area portion AA2 may be adjacent to (or proximate to) the supporting member SS, and the second surface AA2-U of the second area portion AA2 may be adjacent to (or proximate to) the display panel DP. For example, the adhesion force of the first surface AA2-D of the second area portion AA2 may be less than that of the first area portion AA1. In addition, the adhesion force of the first surface AA2-D of the second area portion AA2 may be less than that of the second surface AA2-U of the second area portion AA2.

Figure 3:
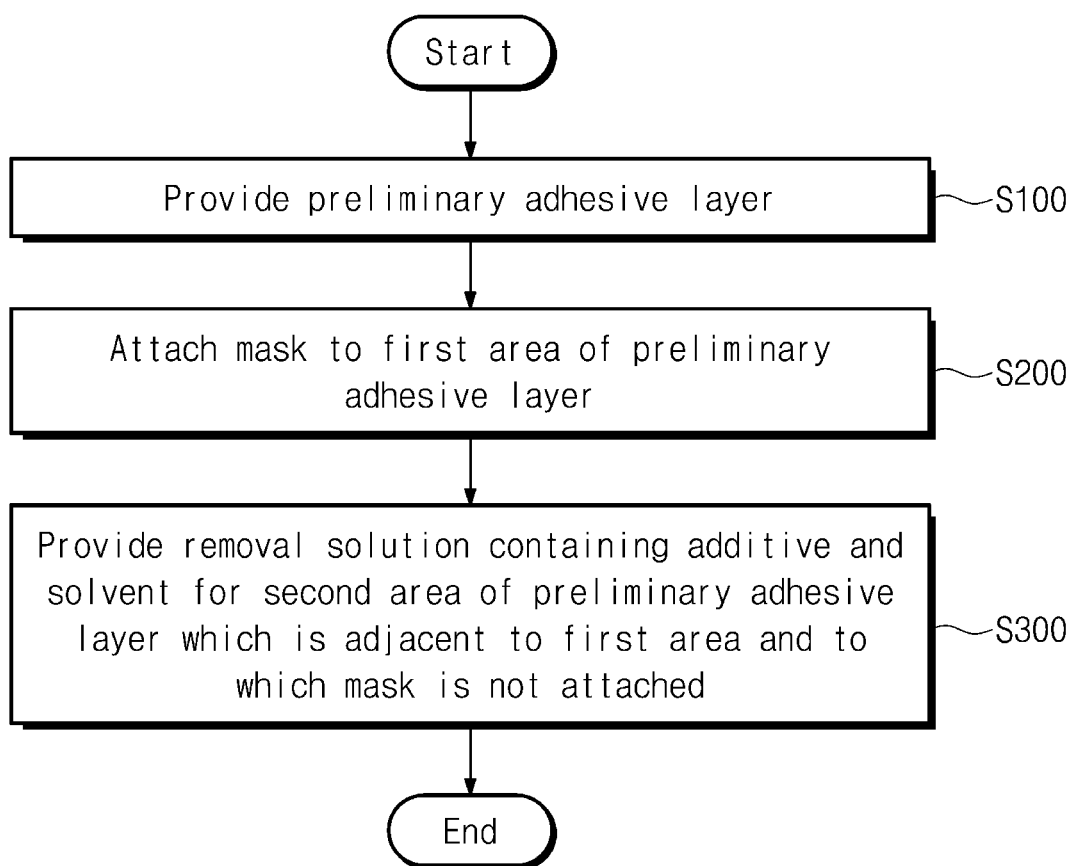
FIG. 3 is a flowchart illustrating a manufacturing method of an adhesive layer according to an embodiment of the inventive concept.

The adhesive layer AL may be formed according to the manufacturing method of the adhesive layer AL of an embodiment. FIG. 3 illustrates a flowchart of the manufacturing method of the adhesive layer AL according to an embodiment of the inventive concept. FIGS. 4 to 6B sequentially illustrate a portion of the manufacturing method of the adhesive layer AL according to an embodiment of the inventive concept.

The manufacturing method of the adhesive layer AL according to an embodiment includes: providing a preliminary adhesive layer AL-P (S100); attaching a mask MSK to a first area portion AA1 of the preliminary adhesive layer AL-P (S200); and providing a removal solution RS for a second area portion AA2 of the preliminary adhesive layer AL-P (S300).

FIG. 4 illustrates the step of providing the preliminary adhesive layer AL-P on a carrier film CM (S100). The carrier film CM may be temporarily provided in order to manufacture the adhesive layer AL. The carrier film CM is set forth herein, but this is not limited to a film, and a temporary member for manufacturing the adhesive layer AL may be used.

Referring to FIG. 4, the preliminary adhesive layer AL-P may include the first area portion AA1 and the second area portion AA2 as described above. The adhesive layer AL may be formed from the preliminary adhesive layer AL-P. An adhesion force of the preliminary adhesive layer AL-P may be uniform. That is, in the preliminary adhesive layer AL-P, a first initial adhesion force of the first area portion AA1 may be the same as a second initial adhesion force of the second area portion AA2.

The preliminary adhesive layer AL-P may be a pressure sensitive adhesive (PSA) including a silicone-containing resin. An alcohol group (—OH) or an alkoxy group (—OR) contained in the silicone-containing resin may be each independently substituted with an alkyl group or an aryl group in the step of providing the removal solution RS (S300) as described below. For example, one or more of the alcohol group and the alkoxy group may be independently substituted with an alkyl group. When the alcohol group and the alkoxy group are substituted with an alkyl group, the adhesion force of the second area portion may be variably reduced depending upon the substitution of the silicone-containing resin. The removal solution RS contacts the second area portion AA2, and thus both of the alcohol group and the alkoxy group may be independently substituted with the alkyl group, and the adhesion force of the second area portion AA2 may be reduced.

Figure 5:
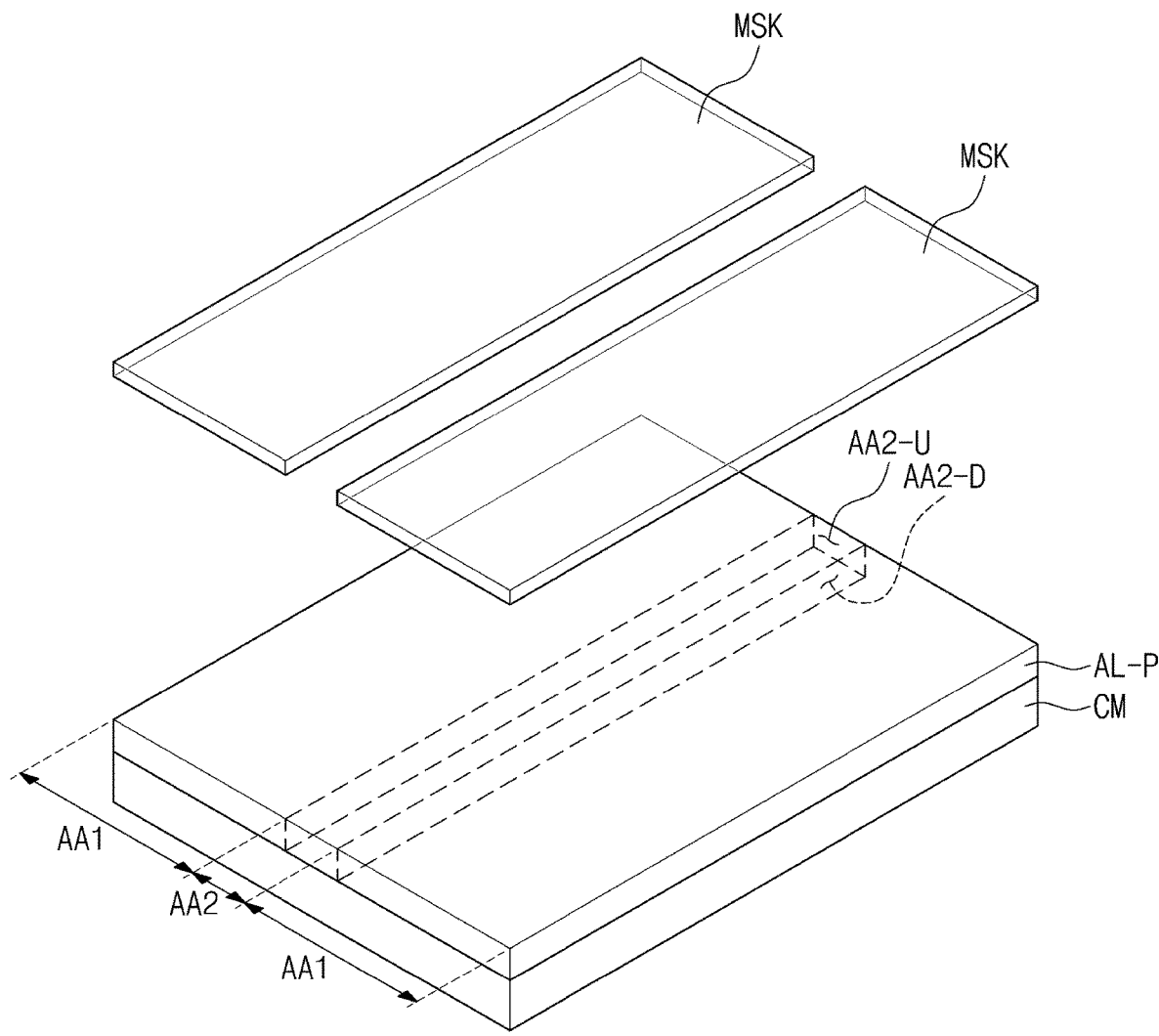
FIG. 5 is a perspective view illustrating a portion of a manufacturing method of an adhesive layer according to an embodiment of the inventive concept.
Figure 6A:
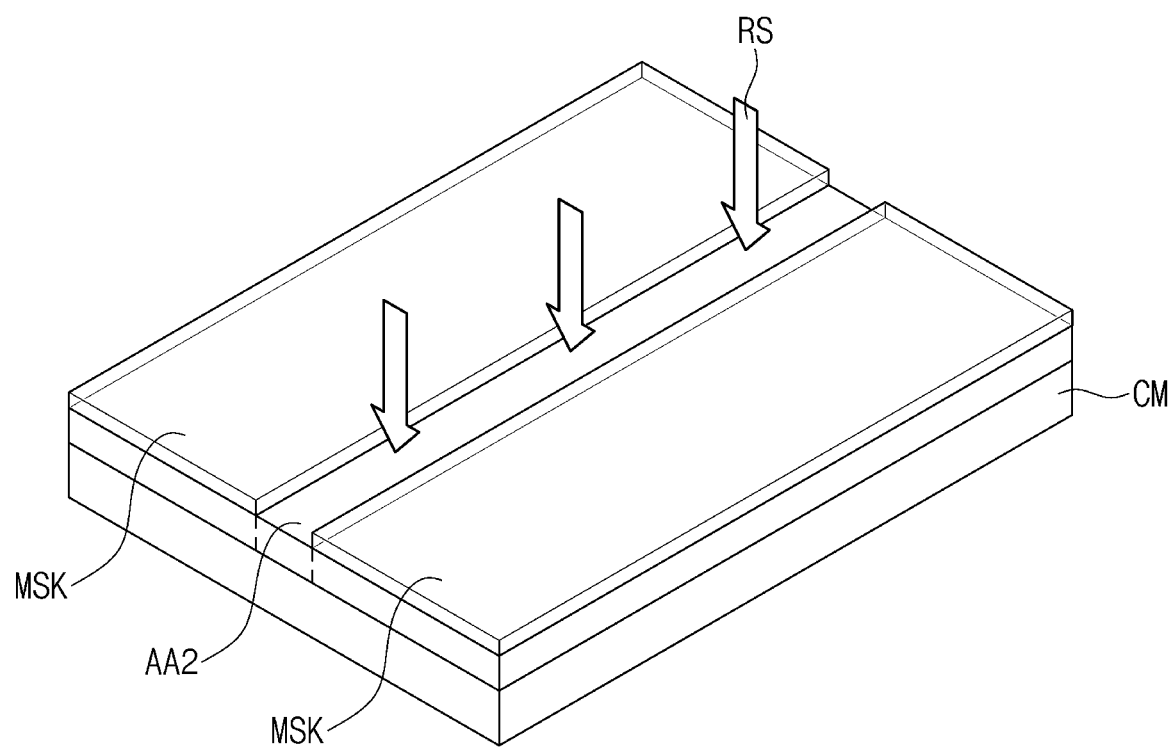
FIG. 6A is a perspective view illustrating a portion of a manufacturing method of an adhesive layer according to an embodiment of the inventive concept.
Figure 6B:
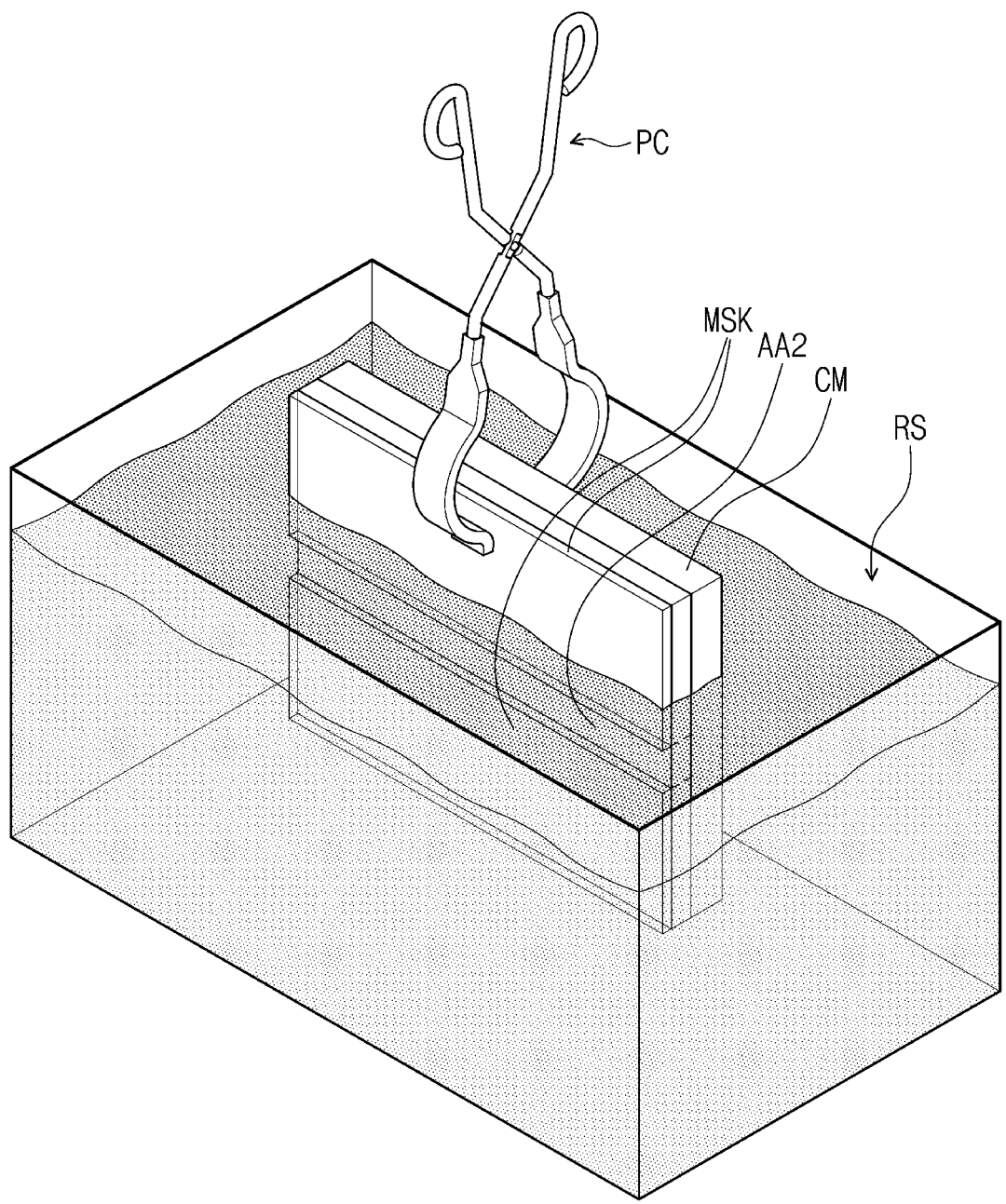
FIG. 6B is a perspective view illustrating a portion of a manufacturing method of an adhesive layer according to an embodiment of the inventive concept.

FIG. 5 illustrates the step of attaching the mask MSK to the first area portion AA1 (S200). FIGS. 6A and 6B illustrate the step of providing the removal solution RS for contact with the second area portion AA2 (S300).

The mask (MSK) which is attached to one surface of the first area portion AA1 may preclude or minimize the contact of the removal solution RS with the first area portion AA1. The mask MSK is provided in order to preclude, block, or minimize the contact of the solution to the one surface of the first area portion AA1. However, the embodiments are not limited thereto, and other members to preclude or minimize contact of the removal solution RS with the first area portion AA1 may be used.

The removal solution RS contacts the second area portion AA2 to which the mask MSK is not attached. The removal solution RS may be a solution for reducing a surface adhesion force corresponding to the second area portion AA2. The removal solution RS may contain a solvent and an additive.

According to an embodiment, the solvent may include at least one of alcohol, xylene, toluene, benzene, and formamide. For example, the solvent may include an alcohol such as methanol, ethanol, or isopropanol.

The additive according to an embodiment may be a silicon-containing compound. For example, hexamethyldisilazane, hexamethyldisiloxane, or chlorotrimethylsilane may be used as an additive. However, the embodiments are not limited thereto.

In the description, the term "substituted or unsubstituted" may mean substituted or unsubstituted with at least one of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, or a heterocyclic group. In addition, each of the substituents exemplified above may be substituted or unsubstituted. For example, a biphenyl group may be interpreted as an aryl group or a phenyl group substituted with a phenyl group.

In the description, examples of the halogen atom may include a fluorine atom, a chlorine atom, a bromine atom, and an iodine atom.

In the description, the alkyl group may be a linear, branched, or cyclic. The number of carbon atoms in the alkyl group may be 1 to 30, 1 to 20, 1 to 10, or 1 to 6. Examples of the alkyl group may include, but are not limited to, methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldodecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, or n-triacontyl group, etc.

In the description, an aryl group means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include, but are not limited to, a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, or a chrysenyl group, etc.

The silicon-containing compound of an embodiment may be represented by Formula 1 or Formula 2:

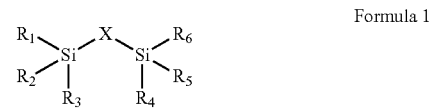

Formula 1

In Formula 1, X may be NH or O.

$R_1$ to $R_6$ may be each independently a hydrogen atom, a halogen atom, a substituted or unsubstituted alkyl group having 1 to 10 carbon atoms, or a substituted or unsubstituted aryl group having 6 to 10 carbon atoms. For example, $R_1$ to $R_6$ may be independently an unsubstituted alkyl group having 1 to 5 carbon atoms, or each $R_1$ to $R_6$ may be the same.

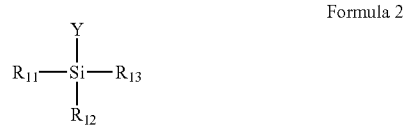

Formula 2

In formula 2, Y may be Cl, Br, I, or $OR_{14}$. For example, Y may be Cl or $OR_{14}$.

Ru to $R_{14}$ may be each independently a hydrogen atom, a halogen atom, a substituted or unsubstituted alkyl group having 1 to 10 carbon atoms, or a substituted or unsubstituted aryl group having 6 to 10 carbon atoms. For example, Ru to $R_{14}$ may be independently an unsubstituted alkyl group having 1 to 5 carbon atoms, or each Ru to $R_{14}$ may be the same.

Meanwhile, at least one of $R_1$ to $R_6$ and Ru to $R_{14}$ may be independently substituted (instead of the alcohol group and the alkoxy group) in the above-described silicone-containing resin. For example, $R_1$ to $R_6$ may be each independently an unsubstituted alkyl group having 1 to 5 carbon atoms, or the alcohol converted to the alkoxy group contained in the silicone-containing resin may be substituted with the alkyl group.

FIGS. 6A and 6B illustrate the step of providing the removal solution RS for the second area portion AA2 (S300). FIG. 6A illustrates a method for spraying the removal solution RS to the preliminary adhesive layer AL-P. Unlike this, FIG. 6B illustrates immersing the preliminary adhesive layer AL-P into the removal solution RS. However, the embodiments are not limited thereto.

FIG. 6A illustrates spraying the removal solution RS to the second area portion AA2. FIG. 6B illustrates immersing a portion of the preliminary adhesive layer AL-P into the removal solution RS.

The removal solution RS is sprayed to the second area portion AA2, and the adhesion force of the second area portion AA2 may be reduced. That is, an initial adhesion force of the second area portion AA2 before contact with the removal solution RS may be different from a second adhesion force of the second area portion AA2 after contact with the removal solution RS. The second adhesion force of the second area portion AA2 may be less than the second initial adhesion force of the second area portion AA2. The alcohol group and the alkoxy group contained in the above-described silicone-containing resin are each independently substituted with an alkyl group or an aryl group, and thus the adhesion force may be reduced.

In addition, after the providing the removal solution RS (S300), the adhesion force of a first surface AA2-D and a second surface AA2-U of the second area AA2 portion may be different, e.g., reduced. Referring to FIG. 6A, a first surface AA2-D of the second area portion AA2 is exposed to the removal solution RS, and the second surface AA2-U of the second area portion AA2, which is in contact with the carrier film CM, may not as readily come in contact with the removal solution RS. That is, the removal solution RS may be provided only for contact with a first surface AA2-D or the second surface AA2-U of the second area portion AA2.

The mask (MSK) is attached to the first area portion AA1, which may preclude, block, or minimize the removal solution RS from contacting the first area portion AA1. The adhesion force of the first region AA1, therefore, may be maintained. That is, an initial adhesion force of the first area portion AA1 of the preliminary adhesive layer AL-P may be the same as a first adhesion force of the first area portion AA1 of the adhesive layer AL formed from the preliminary adhesive layer AL-P, that is, after the contact of the AL-P with the removal solution.

Meanwhile, unlike FIG. 6A, FIG. 6B illustrates that the second area portion AA2 is immersed in the removal solution RS. Pincers PC may be used in order to immerse the second area portion AA2 into the removal solution RS. The pincers PC are for moving the preliminary adhesive layer AL-P, and other tools in addition to the pincer PC may be used in order to move the preliminary adhesive layer AL-P.

Meanwhile, the second area portion AA2 is in contact with the removal solution RS, and thereby, the adhesion force may be reduced. The first area portion AA1 to which the mask MSK is attached does not as readily come in contact with the removal solution RS, and the adhesion force of the first area portion AA1 may be maintained. The same described as those in FIG. 6A may be applied with respect to the second area portion AA2 and the first area portion AA1 to which the mask MSK is attached.

Meanwhile, although not shown, after the step of providing the removal solution RS, the carrier film CM and the mask MSK may be removed.

Figure 7:
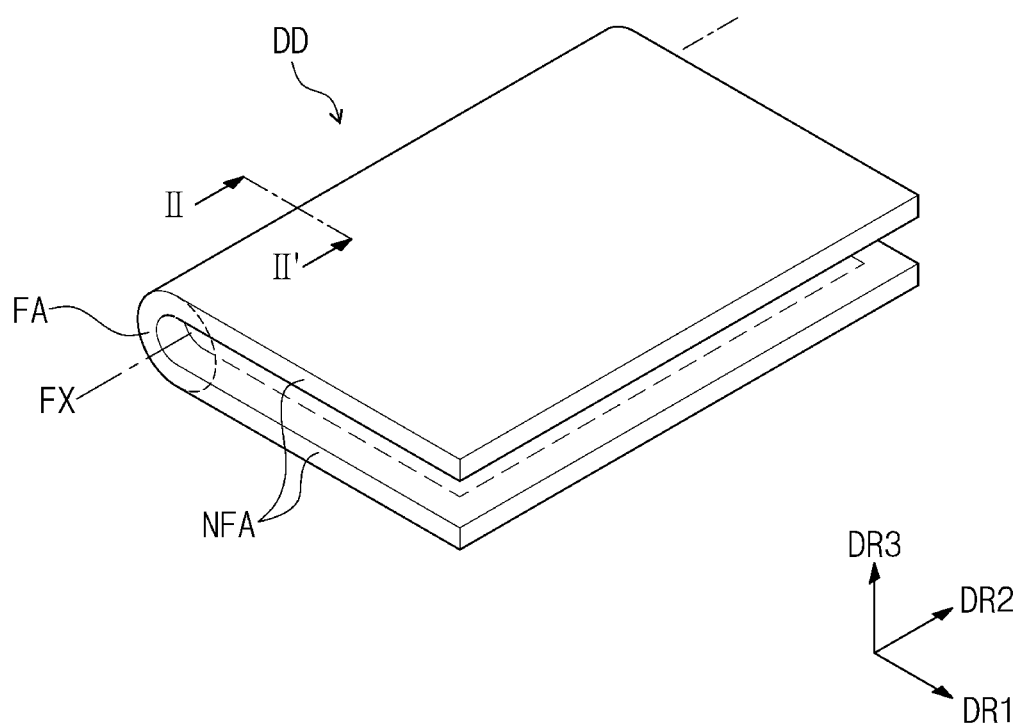
FIG. 7 is a view illustrating a folding state of the display device shown in FIG. 1.
Figure 8:
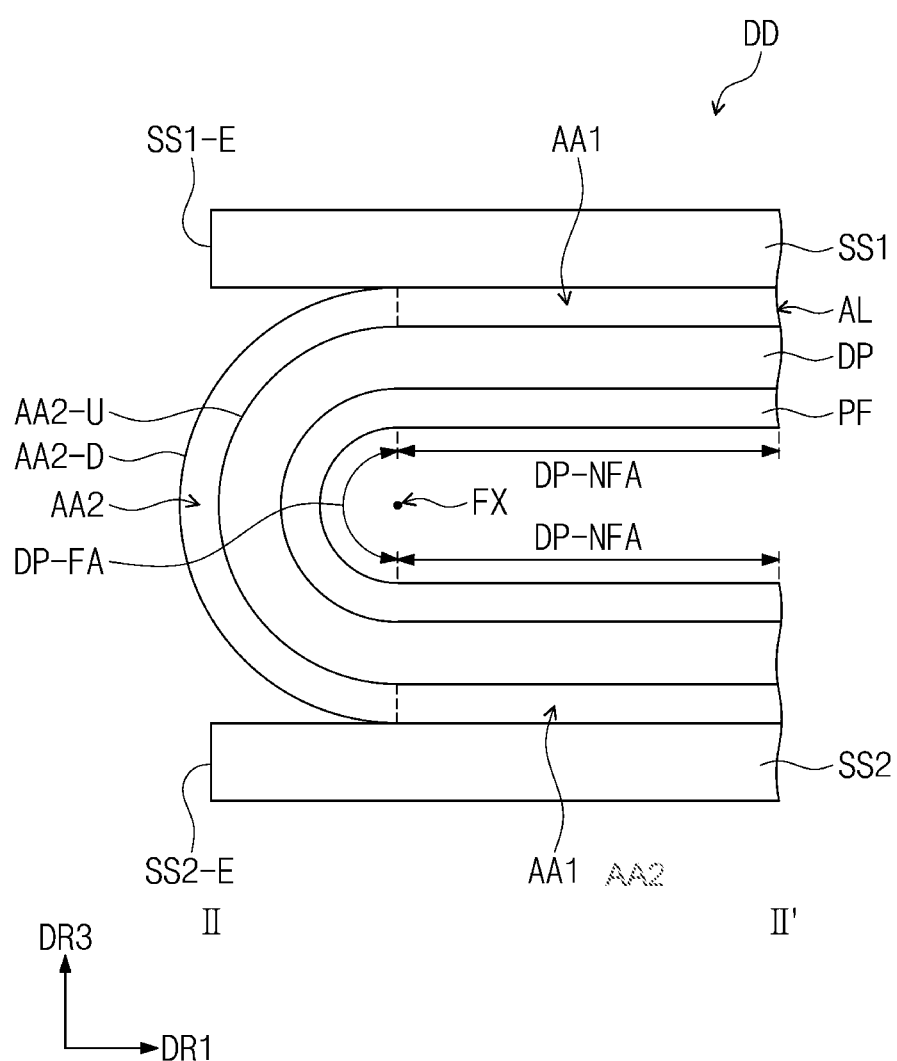
FIG. 8 is a cross-sectional view illustrating a part taken along line II-II' of FIG. 7.
Figure 9:
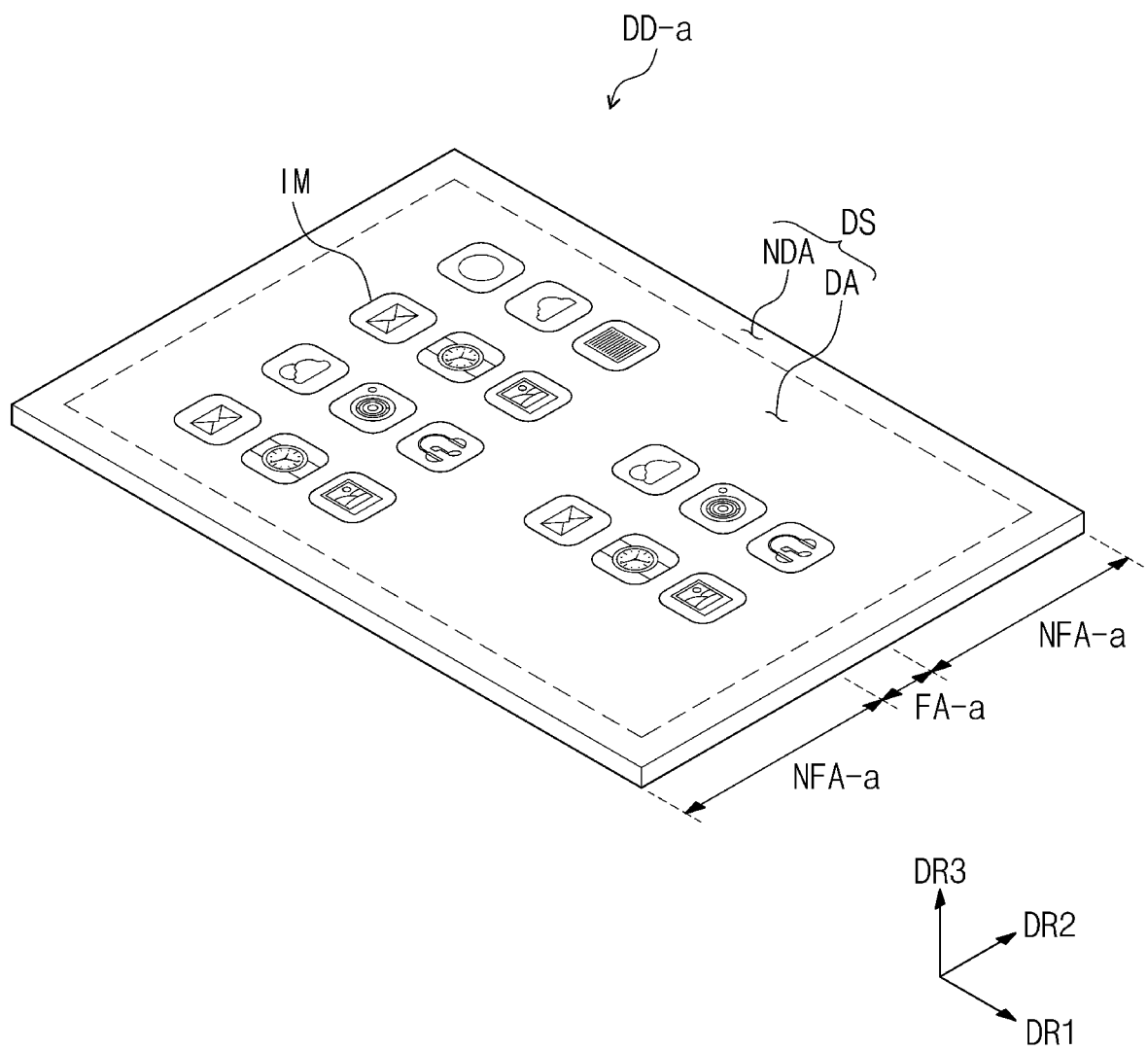
FIG. 9 is a perspective view illustrating a non-folding state of a display device according to an embodiment of the inventive concept.

FIG. 7 shows a folding state of the display device DD according to an embodiment of the inventive concept. FIG. 8 shows a part taken along line II-II' of FIG. 7. FIG. 9 shows a display device DD-a according to an embodiment, and FIG. 10 illustrates a folding state of the display device DD-a of FIG. 9.

Figure 10:
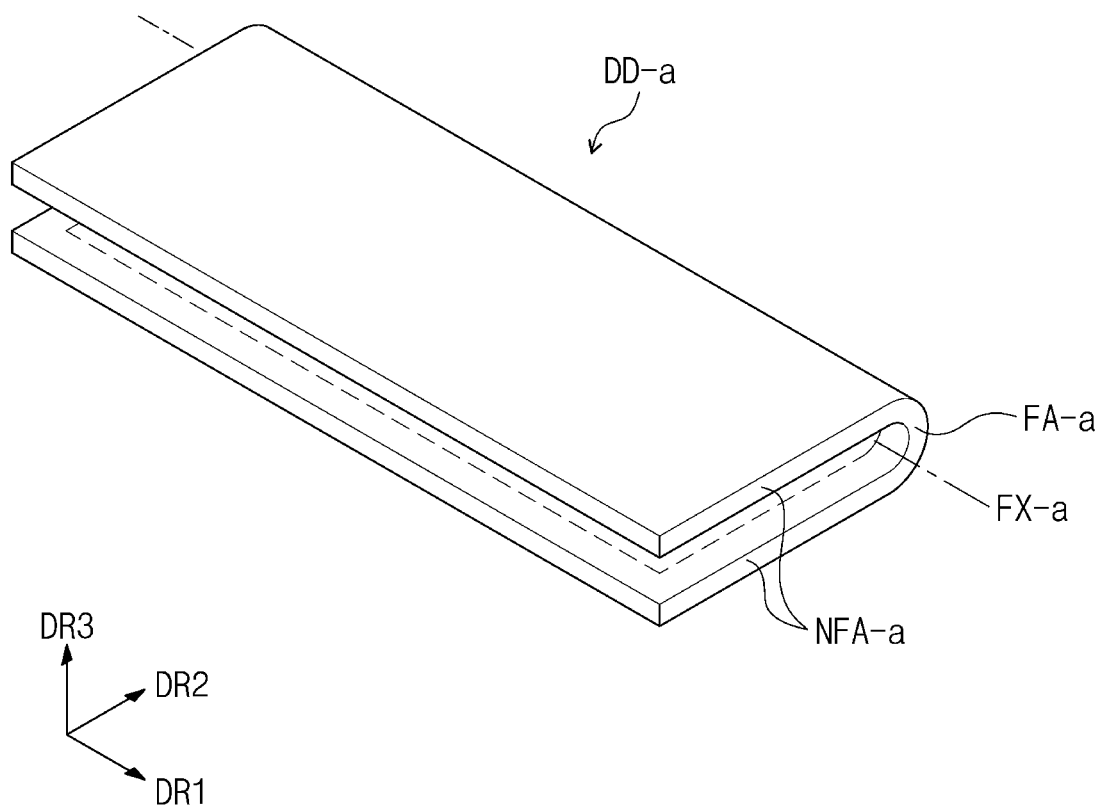
FIG. 10 is a view illustrating a folding state of a display device shown in FIG. 9.

FIGS. 7 and 10 illustrate that the display devices DD and DD-a according to embodiments are folded along folding axes FX and FX-a, respectively. The folding axis FX of FIG. 7 is parallel to the extending direction of the second directional axis DR2, and is illustrated as a short axis parallel to the short sides of the display device DD. On the contrary, the folding axis FX-a of FIG. 10 is parallel to the extending direction of the first directional axis DR1, and is illustrated as a long axis parallel to the long sides of the display device DD-a.

Referring to FIGS. 7 and 10, when the display devices DD and DD-a are folded, the non-folding areas NFA face each other, and the display devices DD and DD-a may be in-folded so that the display surface DS is not exposed to the outside.

The display device DD of an embodiment may be unfolded such that the non-folding areas NFA are disposed in a parallel manner in a first mode, and may be folded such that the non-folding areas NFA are laid over each other in a second mode. That is, FIGS. 1 and 2 may show the first mode, and FIGS. 7 and 8 may show the second mode.

As shown in FIG. 8, in the second mode, the second area portion AA2 may be disposed over the folding area DP-FA. In the second mode, the second area portion AA2 may be spaced apart from the first supporting member SS1 and the second supporting member SS2. That is, in the second mode, one edge SS1-E of the first supporting member SS1 and one edge SS2-E of the second supporting member SS2 may be spaced apart from the second area portion AA2, and a first surface AA2-D of the second area AA2 portion may be exposed.

Meanwhile, in the first mode, one edge SS1-E of the first supporting member SS1 and one edge SS2-E of the second supporting member SS2 may be disposed beneath the second area portion AA2 and the folding area DP-FA of the display panel DP. In the first mode, the first supporting member SS1 and the second supporting member SS2 may be disposed in a parallel manner.

The adhesion force of a first surface AA2-D of the second area portion AA2 spaced apart from the first supporting member SS1 and the second supporting member SS2 may be less than that of a second surface AA2-U of the second area portion AA2 in contact with the folding area DP-FA of the display panel DP. In addition, the adhesion force of the second surface AA2-U of the second area portion AA2 may be the same as that of the first area portion AA1. That is, the adhesion force of the first surface AA2-D of the second area portion AA2 may be less than that of the second surface AA2-U of the second area portion AA2 and that of the first area portion AA1. The adhesion force of the adhesive layer AL area in contact with the display panel DP may be uniform.

EXAMPLES

Evaluation results of reliability in display devices of Comparative Examples and Examples are listed in Table 1 below. The compounds used in the making of the adhesive layers of Examples 1 to 6 are listed in Table 2. In display devices of Comparative Examples and Examples, the type of the adhesive layer, the components of the adhesive layer, and whether a method for removing an adhesion force is applied are varied, and thus the degree of display surface deformation (crease) and folding reliability according to the folding of the display device are indicated. The folding reliability was evaluated by repeatedly folding and unfolding display devices including the adhesive layer 200,000 times. In Table 1, if the evaluation result of the folding reliability is "OK", the folding reliability of the display device is maintained when the folding and unfolding are repeated, and in the case of "NG", the display device is broken or the display panel is damaged when the folding and unfolding are repeated. The degree of display surface deformation of the display device is obtained by measuring the maximum value of the stepped part on the surface of the display panel using a laser microscope (VK-X, Keyence Co., Ltd.).

TABLE 2

| Compound C1 | 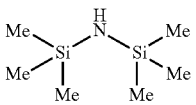 |
| Compound C2 | 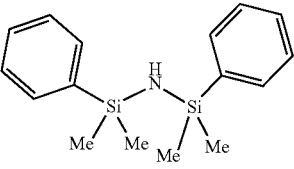 [SMILES: C[Si](C)(N[Si](C)(C)c1ccccc1)c1ccccc1] |
| Compound C3 | 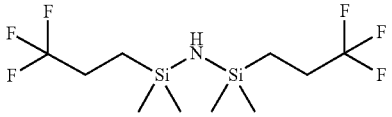 [SMILES: C[Si](C)(CCC(F)(F)F)N[Si](C)(C)CCC(F)(F)F] |
| Compound C4 | 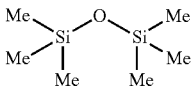 |
| Compound C5 | 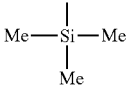 |
| Compound C6 | 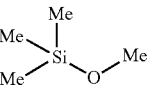 |

The display devices of Examples 1 to 6 include the adhesive layers formed according to the manufacturing method of the adhesive layer of an example. Table 2 shows additives included in the manufacturing method of the adhesive layers of Examples 1 to 6.

Comparative Example 1 includes a separated-type adhesive layer spaced apart from each other on a plane unlike the Examples 1 to 6, wherein the adhesive layer overlaps the non-folding area, and the spaced part does not overlap the folding area. Comparative Examples 2 to 4 are display devices which include an integrated-type adhesive layer in

TABLE 1

| Division | Adhesive layer type | Adhesive layer components | Removing adhesion force | Additives | Display surface deformation degree | Folding reliability |
|---|---|---|---|---|---|---|
| Comparative Example 1 | Separated type | Acrylic | Unremoved | Unprovided | >50 μm | OK |
| Comparative Example 2 | Integrated type | Acrylic | Unremoved | Unprovided | Broken | NG (broken) |
| Comparative Example 3 | Integrated type | Acrylic | UV provided | Unprovided | Broken | NG (damaged) |
| Comparative Example 4 | Integrated type | Silicone | Unremoved | Unprovided | Broken | NG (broken) |
| Example 1 | Integrated type | Silicone | Removed | Compound C1 | <20 μm | OK |
| Example 2 | Integrated type | Silicone | Removed | Compound C2 | <20 μm | OK |
| Example 3 | Integrated type | Silicone | Removed | Compound C3 | <20 μm | OK |
| Example 4 | Integrated type | Silicone | Removed | Compound C4 | <20 μm | OK |
| Example 5 | Integrated type | Silicone | Removed | Compound C5 | <20 μm | OK |
| Example 6 | Integrated type | Silicone | Removed | Compound C6 | <20 μm | OK | which the folding area and the non-folding area of the adhesive layer overlap the display panel.

The adhesive layers of Comparative Examples 1 to 3 include an acrylic-containing resin, and the adhesive layer of Comparative Example 4 includes a silicone-containing resin. In Comparative Examples 1, 2, and 4, the adhesion force of the adhesive layer is uniform, and there are no parts in which the adhesion force is removed. In Comparative Example 3, the adhesion force of the adhesive layer overlapping the folding area is removed by providing ultraviolet rays.

Referring to Table 1, Comparative Example 1 shows acceptable folding reliability, but the degree of display surface deformation is larger in comparison to the Examples 1 to 6. It is determined that since the adhesive layer does not exist at the part overlapping the folding area, the degree of display surface deformation is larger.

In Comparative Examples 2 and 4, when the adhesion force of the second area portion of the adhesive layer overlapping the part in which the supporting members are spaced apart from each other was not removed, the display devices were damaged by a repeated folding of the device. Meanwhile, in Comparative Example 3, the adhesion force of the second region was removed by irradiating with ultraviolet rays (light), but again, the display device was damaged when the display device was repeatedly folded and unfolded because the portion from which the adhesion force was removed was cured.

From the results of the degree of display surface deformation and the folding reliability of Examples 1 to 6, we confirm that the degree of display surface deformation is less than that of Comparative Examples 1 to 4, and the folding reliability is maintained when the folding and unfolding of the device is repeated 200,000 times.

The manufacturing method of an adhesive layer according to an embodiment may include a step of reducing the adhesion force of a part of the adhesive layer overlapping the folding area of the display device, and for example, the adhesion force may be reduced so that the adhesion force value is substantially close to zero. More specifically, the adhesion force of the part of the adhesive layer in contact with the supporting member may be reduced, and the adhesion force of the adhesive layer in contact with the display panel may be maintained. The adhesive layer with reduced adhesion force may reduce stress at or near the folding area when the folding and unfolding are repeated as noted, the display device may exhibit good folding reliability even if the folding and unfolding are repeated 200,000 times.

In addition, the display device according to an embodiment includes an adhesive layer formed by the manufacturing method of the adhesive layer according to an embodiment, is shown to demonstrate good durability and folding reliability.

The manufacturing method of an adhesive layer according to an embodiment of the inventive concept may provide an adhesive layer which exhibits good folding reliability in repeated folding by reducing or removing an adhesion force of the adhesive layer at or near a folding area.

The display device according to an embodiment of the inventive concept may exhibit good folding reliability by including an adhesive layer in which an adhesion force of a folding area of the adhesive layer is reduced or removed.

Although the inventive concept has been described with reference to a preferred embodiment of the inventive concept, it will be understood that the inventive concept should not be limited to these preferred embodiments, but various changes and modifications can be made by those skilled in the art without departing from the spirit and scope of the inventive concept.

Accordingly, the technical scope of the inventive concept is not intended to be limited to the contents set forth in the detailed description of the specification, but is intended to be defined by the appended claims.

What is claimed is:

1. A manufacturing method of an adhesive layer, the method comprising:
   providing a preliminary adhesive layer;
   attaching a mask to a first area portion of the preliminary adhesive layer;
   contacting a second area portion of the preliminary adhesive layer that is adjacent to the first area portion, and to which the mask is not attached, with a removal solution comprising a silicon-containing compound and a solvent, and
   removing the mask from the first area portion, whereby an adhesion force of the contacted second area portion is less than an adhesion force of the first area portion of the preliminary adhesive layer,
   wherein the silicon-containing compound comprises a compound represented by Formula 2 below;

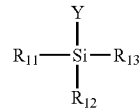

Formula 2 wherein, in Formula 2,
Y is Cl, Br, I, or $OR_{14}$, and
$R_{11}$ to $R_{14}$ are each independently a hydrogen atom, a halogen atom, a substituted or unsubstituted alkyl group having 1 to 10 carbon atoms, or a substituted or unsubstituted aryl group having 6 to 10 carbon atoms.

2. The manufacturing method of an adhesive layer of claim 1, wherein the preliminary adhesive layer comprises a silicone-containing resin that includes alcohol or alkoxy groups.

3. The manufacturing method of an adhesive layer of claim 1, further comprising a silicon-containing compound represented by Formula 1 below:

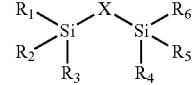

Formula 1 wherein, in Formula 1,
X is NH or O, and
$R_1$ to $R_6$ are each independently a hydrogen atom, a halogen atom, a substituted or unsubstituted alkyl group having 1 to 10 carbon atoms, or a substituted or unsubstituted aryl group having 6 to 10 carbon atoms.

4. The manufacturing method of an adhesive layer of claim 3, wherein $R_1$ to $R_6$ are each independently an unsubstituted alkyl group having 1 to 5 carbon atoms.

5. The manufacturing method of an adhesive layer of claim 1, wherein $R_{11}$ to $R_{14}$ are each independently an unsubstituted alkyl group having 1 to 5 carbon atoms.

6. The manufacturing method of an adhesive layer of claim 1, wherein the contacting of the second area portion with the removal solution comprises immersing the masked preliminary adhesive layer into the removal solution.

7. The manufacturing method of an adhesive layer of claim 1, wherein the contacting of the second area portion with the removal solution comprises spraying the removal solution on a surface of the second area portion of the adhesive layer.

8. The manufacturing method of an adhesive layer of claim 1, wherein the solvent comprises at least one of alcohol, xylene, toluene, benzene, or formamide.

9. The manufacturing method of an adhesive layer of claim 1, wherein following the contacting of the second area portion with the removal solution the initial adhesion force of the first area portion is maintained.

10. The manufacturing method of an adhesive layer of claim 1, wherein the adhesive layer provides folding reliability of a display device after at least 200,000 repeated foldings as a result of the reduced adhesion force of the second area portion which overlaps a folding area of the display device.

* * * * *